United States Patent
Höhnsdorf et al.

(10) Patent No.: US 6,864,170 B2
(45) Date of Patent: Mar. 8, 2005

(54) COMPACT SEMICONDUCTOR STRUCTURE

(75) Inventors: Falko Höhnsdorf, Dresden (DE); Albrecht Kieslich, Radebuel (DE); Detlef Weber, Hermsdorf (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/432,770
(22) PCT Filed: Nov. 28, 2001
(86) PCT No.: PCT/EP01/13900
§ 371 (c)(1), (2), (4) Date: Sep. 26, 2003
(87) PCT Pub. No.: WO02/45165
PCT Pub. Date: Jun. 6, 2002

(65) Prior Publication Data
US 2004/0029374 A1 Feb. 12, 2004

(30) Foreign Application Priority Data
Nov. 28, 2000 (DE) ......................... 100 59 935

(51) Int. Cl.$^7$ .......................................... H01L 21/4763
(52) U.S. Cl. ...................................... 438/624; 438/640
(58) Field of Search .................................. 438/624, 640

(56) References Cited

U.S. PATENT DOCUMENTS

| | | | |
|---|---|---|---|
| 5,747,880 A | * | 5/1998 | Havemann et al. ......... 257/759 |
| 5,751,066 A | * | 5/1998 | Havemann .................. 257/759 |
| 5,843,845 A | * | 12/1998 | Chung ......................... 438/713 |
| 6,066,577 A | | 5/2000 | Cooney, III et al. |
| 6,222,269 B1 | * | 4/2001 | Usami ......................... 257/758 |
| 6,306,754 B1 | * | 10/2001 | Agarwal ...................... 438/619 |
| 6,376,911 B1 | * | 4/2002 | Ryan et al. .................. 257/752 |
| 6,566,241 B2 | * | 5/2003 | Chun ......................... 438/618 |

FOREIGN PATENT DOCUMENTS

| | | |
|---|---|---|
| DE | 43 19070 | 1/1994 |
| EP | 0 687004 | 12/1995 |
| EP | 0 759635 | 2/1997 |
| EP | 0 860880 | 8/1998 |
| JP | 11163523 | 6/1999 |
| JP | 11354638 | 12/1999 |
| JP | 2001 68548 | 3/2001 |

* cited by examiner

Primary Examiner—Matthew Smith
Assistant Examiner—Lex H. Malsawma
(74) Attorney, Agent, or Firm—Fish & Richardson P.C.

(57) ABSTRACT

A method for reducing capacitative coupling between interconnects on a semiconductor structure includes producing a first insulating layer on a semiconductor substrate and etching trenches in the first insulating layer. Metallic interconnects are formed in the trenches by metallization. The semiconductor structure is polished to remove metal from the first insulating layer, leaving behind metal in the trenches. A portion of the first insulating layer between the first and second metallic interconnects is etched so that the first and second metallic interconnects project above the first insulating layer. A second insulating layer is applied on the substrate such that the metallic interconnects project into the second insulating layer. The second insulating layer has a relative permittivity that is lower than the relative permittivity of the first insulating layer.

3 Claims, 2 Drawing Sheets

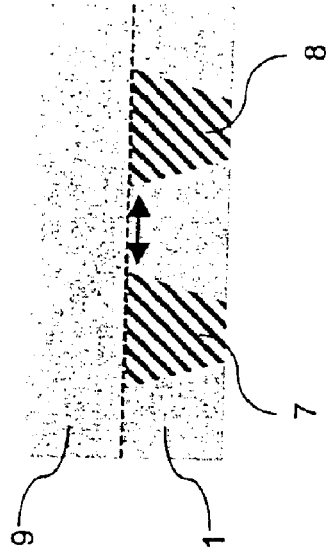
FIG. 2A
FIG. 2B
FIG. 3A
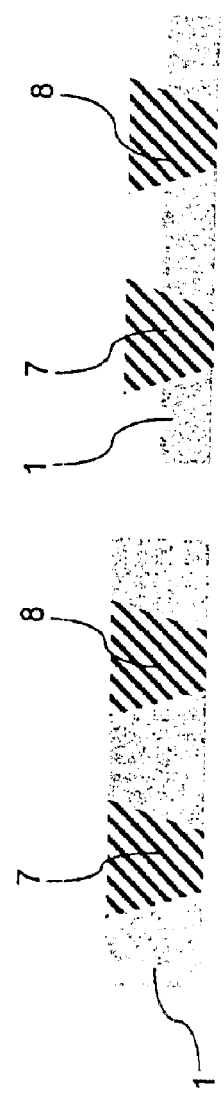
FIG. 3B
FIG. 3C

COMPACT SEMICONDUCTOR STRUCTURE

FIELD OF INVENTION

The invention relates to a densely packed semiconductor structure and a method for fabricating such a semiconductor structure. In particular, the invention relates to a semiconductor structure having an insulator layer on a semiconductor substrate and also at least two metallic interconnects in the insulator layer. The method for fabricating such a semiconductor structure using "damascene technology" comprises the following steps: production of an insulator layer made of a first insulator material on a semiconductor substrate. Definition of regions in the insulator layer made of the first insulator material in which trenches are produced, etching of trenches in the insulator layer made of the first insulator material, production of at least two metallic interconnects by metallization of the insulator layer made of the first insulator material, so that the trenches are filled with metal, and polishing of the semiconductor structure, so that the metallization on the surface of the insulator layer made of the first insulator material is removed.

BACKGROUND

A physical limit is imposed on the "shrinking" of such semiconductor structures, i.e. the scaling down of the structure width and the minimum distances between the interconnects. With ever smaller structure widths, the electrical coupling of two tracks running parallel increases drastically. This undesirable parasitic effect leads from performance losses through to functionality failures. In particular, a capacitive coupling between word and bit lines or between two adjacent word lines and thus a signal loss may occur. Even in existing DRAM generations, both effects lead to losses in the circuit speed or to functionality failures (e.g. BLC: Bit Line Coupling).

To date, coupling effects of this type have been compensated for by adapting the design of the semiconductor structure, e.g. by designing the word and bit lines to be shorter. However, this is ultimately connected with a higher area requirement.

It is an object of the invention to reduce the capacitive coupling between adjacent metallic interconnects of a semiconductor structure and thus to make it possible to fabricate a more densely packed semiconductor structure.

This object is achieved according to the invention by means of a semiconductor structure according to claim 1, and a method for fabricating such a semiconductor structure according to claim 4. The subclaims relate to preferred embodiments of the invention.

SUMMARY $SiO_2$, which has hitherto been used as a dielectric (intermetal dielectric, IMD), has a relative permittivity of $\epsilon=3.9$, so that capacitive coupling effects become perceptible below a certain distance between adjacent interconnects. This capacitive coupling could be reduced by using novel materials as IMD with a lower relative permittivity (so-called low-k materials) with an $\epsilon<3.9$. However, since the low-k materials that are known nowadays are generally stable only up to temperatures of 450° C., the dielectric (the M0 plane) cannot be produced with this material from the outset because, after the production of the dielectric, one or more heat treatment steps (annealing) are necessary, in a manner governed by the overall process, at relatively high temperatures: the heat treatment, e.g. after an implantation (implant annealing), takes place at 960° C., and the heat treatment after e.g. the metallization takes place at 800° C.

It is only by subsequently etching back the $SiO_2$ that it becomes possible to fabricate the dielectric between metallic interconnects in the M0 plane from a low-k material. The filling properties of the low-k material are exploited in this case.

The semiconductor structure according to the invention is characterized in that the insulator layer comprises a first insulator layer of predetermined thickness made of a first insulator material, and a second insulator layer of predetermined thickness made of a second insulator material, which is arranged above the first insulator layer, the at least two metallic interconnects extending from the first insulator layer into the second insulator layer, and the second insulator material has a lower relative permittivity than the first insulator material.

Accordingly, the method for fabricating such a semiconductor structure comprises the etching-back of the first insulator layer between the interconnects, so that the at least two metallic interconnects project above adjacent regions of the first insulator layer, and the production of a second insulator layer made of a second insulator material on the semiconductor structure, so that the at least two metallic interconnects extend from the first insulator layer into the second insulator layer, the second insulator material having a lower relative permittivity than the first insulator material.

In a preferred embodiment of the invention, the lower insulator layer comprises $SiO_2$ with a relative permittivity of 3.9; the relative permittivity of the upper insulator layer is, in particular, less than 3.9.

One advantage of the invention is that only an (etching) step which is simple to control additionally has to be performed, but for the rest the method is not significantly more complicated than the method according to the prior art.

Further features and advantages of the invention emerge from the following description of a preferred embodiment, in which reference is made to the accompanying drawings.

BRIEF DESCRIPTION OF THE FIGURES

FIGS. 2A and B each diagrammatically show the cross section through a semiconductor structure with two metallic interconnects according to the prior art.

FIGS. 3A to C each diagrammatically show the cross section through a semiconductor structure according to the invention with two metallic interconnects.

DETAILED DESCRIPTION

Metallic interconnects of an integrated circuit are preferably fabricated by means of a damascene method. In the damascene method, firstly the intermetal dielectric (IMD) is applied, and then trenches are etched into the IMD. In the case of Si semiconductor substrates, the IMD is preferably obtained by means of suitable CVD deposition. The trenches are filled with metal by the metal being deposited over the whole area on the semiconductor substrate and then being removed again from the elevated regions of the IMD by means of CMP or etching-back.

Figures 1A, 1B, 1C:
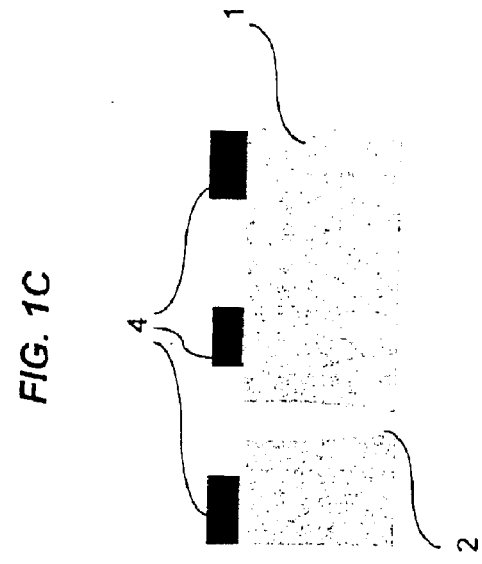
FIGS. 1A to F each diagrammatically show the cross section through a semiconductor structure during the individual steps of a contact connection or during the fabrication of interconnects by means of the "damascene technology".
Figures 1D, 1E, 1F:
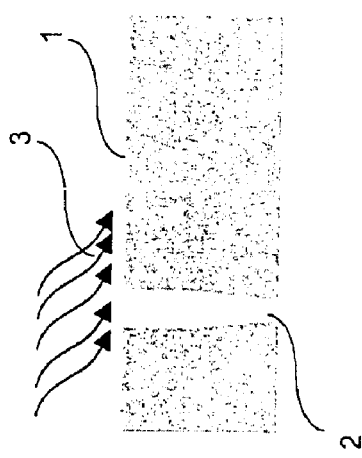

FIGS. 1A to F diagrammatically illustrate the individual steps of a typical dual damascene method. FIG. 1A illustrates an insulator layer 1 (grey area), in which a (contact) opening 2 for a connection to the semiconductor (not illustrated) situated underneath is provided. After the fabrication of the opening by etching, the semiconductor structure is subjected to heat treatment by heat supply 3 (FIG. 1B). This "annealing step" takes place at a temperature of 800 to 960° C. Afterward, a mask 4 is produced lithographically on the semiconductor structure, which mask defines the regions in which trenches or further openings are etched (M0 lithography step in FIG. 1C). The etching yields the trenches 5 or expanded openings 2 within the mask windows 4 as shown in FIG. 1D. Afterward, the mask 4 is removed and the semiconductor structure is metallized, i.e. completely covered with metal (tungsten). Only the metal in the trenches 5 or in the contact windows 2 is required, however. The excess metal is removed again by chemical mechanical polishing (CMP), finally resulting in the semiconductor structure with two metallic interconnects 7 and 8 according to FIG. 1F.

For the fabrication of the semiconductor structure according to FIG. 2A, two interconnects were produced in the insulator layer in the manner described with reference to FIG. 1. To that end, a first insulator layer 1 made of a first insulator material was produced on a semiconductor substrate (not illustrated), windows in which trenches 5 are produced were defined in the first insulator layer, the trenches 5 were etched in the first insulator layer 1, the two metallic interconnects 7 and 8 were produced in the trenches 5 by metallization of the semiconductor structure, so that the trenches 5 in the first insulator layer 1 are filled with metal 6, and the semiconductor structure was polished, so that the metallization 6 is removed on the surface of the first insulator layer 1 and the metal 6 remains essentially only in the trenches 5.

The resulting semiconductor structure comprises an insulator layer 1 on a semiconductor substrate (not illustrated) and at least two metallic interconnects 7 and 8 in the insulator layer 1.

FIG. 2B illustrates the semiconductor structure after the deposition of a covering second layer of the first insulator material 9, the first and second layers of the first insulator material being separated by a dashed line for illustration purposes. However, the lower insulator layer 1 and the upper insulator layer 9 are generally essentially homogeneous. A double arrow between the upper edges of the two interconnects 7 and 8 indicates the mutual capacitive coupling. This coupling prevents the interconnects 7 and 8 from being packed more densely, since, below a specific distance between the interconnects, it leads to disturbances in the signals on one or both of the interconnects.

In order nevertheless to enable a higher packing density than according to this prior art, according to the invention the method is modified as illustrated in FIGS. 3A to C.

After the completion of the structure in FIG. 3A (it is equivalent to the semiconductor structure in FIG. 2A), before the application of a second insulator layer for the covering of the semiconductor structure, the first insulator layer 1 is etched back selectively, i.e. the insulator layer 1 is removed only between the trenches 5; the metallic interconnects 7 and 8 are not significantly affected by the etching. As soon as the first insulator layer 1 has only a predetermined thickness and the at least two metallic interconnects 7 and 8 project above their adjacent regions of the first insulator layer 1 (FIG. 3B), a second insulator layer 10 made of a second insulator material is produced on the semiconductor structure. As a result, the at least two metallic interconnects 7 and 8 are embedded in the second insulator layer 10 made of the second insulator material in their upper part. In other words, the interconnects in the first insulator layer 1 extend from the first insulator layer 1 into the second insulator layer 10. The second insulator layer 10 is illustrated in hatched fashion in FIG. 3C.

In order to reduce the capacitive coupling between the two interconnects 7 and 8, a material having a lower relative permittivity than the first insulator material is chosen as the second insulator material. In particular, a material is chosen which has a relative permittivity of less than 3.9, compared with 3.9 in the case of $SiO_2$.

In a manner similar to the semiconductor structure according to FIG. 2B, the resulting semiconductor structure according to FIG. 3C comprises a first insulator layer on a semiconductor substrate (not illustrated) and at least two metallic interconnects 7, o in the insulator layer. A second insulator layer 10 (hatched area) of predetermined thickness is arranged above the first insulator layer 1. In contrast to the prior art, however, in the case of the semiconductor structure according to the invention, only the first insulator layer 1 (grey area) of predetermined thickness is made of a first insulator material, while the second insulator layer 10 comprises a second insulator material having a lower relative permittivity than the first insulator material, namely preferably a relative permittivity which is less than 3. Furthermore, unlike in the prior art, the two metallic interconnects 7 and 8 extend from the first insulator layer 1 into the second insulator layer 10.

It must be a further property of the second insulator material, besides that for a low relative permittivity, that voids or shrink holes in the intermetal dielectric layer, which may arise e.g. on account of overhanging metal 1 sidewalls, can be avoided during the production of the second insulator layer 10. What are appropriate for this purpose are filling (gap-filled) materials which are currently being developed (in particular in the case of embedded DRAM elements) and with which even very small cavities can be filled very well.

The surface of the semiconductor structure is finally polished, so that it is finally essentially planar.

What is claimed is:

1. A method for reducing capacitative coupling between interconnects on a semiconductor structure, the method comprising:

producing, on a semiconductor substrate, a first insulating layer having a first relative permittivity;

etching first and second trenches in the first insulating layer;

forming first and second metallic interconnects in the trenches by metallization, thereby filling the trenches with metal;

polishing the semiconductor structure to remove metal from the first insulating layer, leaving behind metal in the trenches;

etching a portion of the first insulating layer between the first and second metallic interconnects, thereby causing the first and second metallic interconnects to project above the first insulating layer; and producing, on the semiconductor substrate, a second insulating layer having a second relative permittivity that is lower than the first relative permittivity, the first and second metallic interconnects projecting into the second insulating layer.

2. The method of claim 1, wherein producing the first insulating layer comprises applying an oxide by chemical vapor deposition.

3. The method of claim 1, wherein producing the first insulating layer comprises producing an insulating layer having a relative permittivity less than 3.9.

* * * * *